United States Patent
Jia et al.

(10) Patent No.: US 12,165,716 B2
(45) Date of Patent: Dec. 10, 2024

(54) METHOD OF PERFORMING PROGRAMMING OPERATION AND RELATED MEMORY DEVICE

(71) Applicant: YANGTZE MEMORY TECHNOLOGIES CO., LTD., Wuhan (CN)

(72) Inventors: Xinlei Jia, Wuhan (CN); Shan Li, Wuhan (CN); Yali Song, Wuhan (CN); Lei Jin, Wuhan (CN); Hongtao Liu, Wuhan (CN); Jianquan Jia, Wuhan (CN); Xiangnan Zhao, Wuhan (CN); Yuan-Yuan Min, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 224 days.

(21) Appl. No.: 17/869,511

(22) Filed: Jul. 20, 2022

(65) Prior Publication Data

US 2022/0359021 A1 Nov. 10, 2022

Related U.S. Application Data

(63) Continuation-in-part of application No. 17/180,689, filed on Feb. 19, 2021, now Pat. No. 11,398,284.

(Continued)

(51) Int. Cl.
*G11C 16/10* (2006.01)
*G11C 16/04* (2006.01)
(Continued)

(52) U.S. Cl.
CPC ...... *G11C 16/3427* (2013.01); *G11C 16/0483* (2013.01); *G11C 16/08* (2013.01); *G11C 16/10* (2013.01)

(58) Field of Classification Search
CPC . G11C 16/3427; G11C 16/0483; G11C 16/08; G11C 16/10; G11C 16/32
See application file for complete search history.

(56) References Cited

U.S. PATENT DOCUMENTS 10,431,311 B2 * 10/2019 Izumi .................... H10B 43/27
10,580,504 B2    3/2020 Zhao et al.
(Continued)

FOREIGN PATENT DOCUMENTS

JP   2019109952 A   7/2019
WO   2011/149823 A1   12/2011

*Primary Examiner* — Xiaochun L Chen
(74) *Attorney, Agent, or Firm* — BAYES PLLC (57) ABSTRACT

A memory device includes a memory array including memory strings, each memory string comprising a plurality of first memory cells, a plurality of second memory cells, and one or more dummy memory cells between the first memory cells and the second memory cells. The first memory cells are between drain terminals of the memory strings and the dummy memory cells, and the second memory cells are between source terminals of the memory strings and the dummy memory cells. The bit lines are respectively coupled to drain terminals of the memory strings. The word lines are respectively coupled to gate terminals of the first memory cells and the second memory cells. A word line driver is configured to apply a first voltage signal to each of the word lines that are coupled to the gate terminals of the first memory cells during a pre-charge phase.

19 Claims, 10 Drawing Sheets

Related U.S. Application Data which is a continuation of application No. 16/792,304, filed on Feb. 17, 2020, now Pat. No. 10,957,409, which is a continuation of application No. PCT/CN2019/118312, filed on Nov. 14, 2019.

(51) Int. Cl.
*G11C 16/08* (2006.01)
*G11C 16/34* (2006.01)

(56) References Cited

U.S. PATENT DOCUMENTS

| | | |
|---|---|---|
| 2004/0027856 A1 | 2/2004 | Lee et al. |
| 2013/0163330 A1 | 6/2013 | Sharon |
| 2015/0179269 A1 | 6/2015 | Lee |
| 2017/0084315 A1 | 3/2017 | Lee |
| 2019/0189218 A1* | 6/2019 | Izumi .................... G11C 16/10 |
| 2019/0189223 A1 | 6/2019 | Yun |

\* cited by examiner

METHOD OF PERFORMING PROGRAMMING OPERATION AND RELATED MEMORY DEVICE

CROSS-REFERENCE TO RELATED APPLICATIONS

This application is a continuation-in-part of U.S. application Ser. No. 17/180,689, filed on Feb. 19, 2021, which is a continuation of U.S. application Ser. No. 16/792,304, filed on Feb. 17, 2020, which is a continuation of International Application No. PCT/CN2019/118312 filed on Nov. 14, 2019, all of which are incorporated herein by reference in their entireties.

BACKGROUND

The present disclosure relates to a method of operating a memory device, and more particularly, to a method of operating a three-dimensional (3D) NAND memory device.

Semiconductor memories are widely used in various electronic devices such as cellular phones, digital cameras, personal digital assistants, medical electronic devices, mobile computing devices and non-mobile computing devices. A nonvolatile memory allows information to be stored and retained. Examples of the nonvolatile memory comprises a flash memory (e.g., NAND type and NOR type flash memory) and electrically erasable programmable read only memory (Electrically Erasable Programmable Read-Only Memory, EEPROM).

SUMMARY

It is therefore an objective of the present disclosure to provide a method and related memory device to reduce program disturb.

In one aspect, a memory device includes a memory array including memory strings, each memory string comprising a plurality of first memory cells, a plurality of second memory cells, and one or more dummy memory cells between the first memory cells and the second memory cells, wherein the first memory cells are between drain terminals of the memory strings and the dummy memory cells, and the second memory cells are between source terminals of the memory strings and the dummy memory cells, a plurality of bit lines respectively coupled to drain terminals of the memory strings, a plurality of word lines respectively coupled to gate terminals of the first memory cells and the second memory cells, a control circuit configured to provide one or more control signals to control operations of the memory array, and a word line driver coupled to the control circuit and the word lines and configured to, in response to the one or more control signals, apply a first voltage signal to each of the word lines that are coupled to the gate terminals of the first memory cells during a pre-charge phase prior to a programming phase.

In some implementations, the word line driver is further configured to apply a second voltage signal to a first word line during the programming phase, and the first word line is adjacent to a selected word line towards the bit lines.

In some implementations, the word line driver is further configured to apply a third voltage signal greater than the second voltage signal to a second word line during a last time period of the pre-charge phase, and the second word line is adjacent to the first word line towards the bit lines.

In some implementations, the word line driver is further configured to apply a fourth voltage signal greater than the second voltage signal to the each of the word lines that are coupled to the gate terminals of the first memory cells except the selected word line and the first word line during the programming phase.

In some implementations, the word line driver is further configured to apply a fifth voltage signal greater than the fourth voltage signal to the selected word line during the programming phase.

In some implementations, the word line driver is further configured to apply a sixth voltage signal to a first top select word line and a second top select word line of the word lines during the pre-charge phase, and apply a seventh voltage signal to the second top select word line of the word lines during the programming phase.

In some implementations, the bit lines include a first bit line coupled to the drain terminal of a selected memory string of the memory strings, and the control signal is configured to cause applying an eighth voltage signal to the first bit line during the pre-charge phase.

In some implementations, the six voltage signal ramps down earlier than the eighth voltage signal.

In another aspect, a method for operating a memory device is provided. The memory device includes (1) memory strings, each memory string comprising a plurality of first memory cells, a plurality of second memory cells, and one or more dummy memory cells between the first memory cells and the second memory cells, wherein the first memory cells are between drain terminals of the memory strings and the dummy memory cells, and the second memory cells are between source terminals of the memory strings and the dummy memory cells, (2) a plurality of bit lines respectively coupled to drain terminals of the memory strings, and (3) a plurality of word lines respectively coupled to gate terminals of the first memory cells and the second memory cells. The method includes providing one or more control signals to control operations of the memory strings, and in response to the one or more control signals, applying a first voltage signal to each of the word lines that are coupled to the gate terminals of the first memory cells during a pre-charge phase prior to a programming phase.

In some implementations, the method further includes applying a second voltage signal to a first word line during the programming phase, wherein the first word line is adjacent to a selected word line towards the bit lines.

In some implementations, the method further includes applying a third voltage signal greater than the second voltage signal to a second word line during a last time period of the pre-charge phase, and the second word line is adjacent to the first word line towards the bit lines.

In some implementations, the method further includes applying a fourth voltage signal greater than the second voltage signal to the each of the word lines that are coupled to the gate terminals of the first memory cells except the selected word line and the first word line during the programming phase.

In some implementations, the method further includes applying a fifth voltage signal greater than the fourth voltage signal to the selected word line during the programming phase.

In some implementations, the method further includes applying the third voltage signal to the second word line before applying the fourth voltage signal to each of the word lines except the selected word line and the first word line.

In some implementations, the method further includes applying a sixth voltage signal to a first top select word line and a second top select word line of the word lines during the pre-charge phase, and apply a seventh voltage signal to the second top select word line of the word lines during the programming phase.

In some implementations, the bit lines include a first bit line coupled to the drain terminal of a selected memory string of the memory strings, and the method further includes applying an eighth voltage signal to the first bit line during the pre-charge phase, wherein the six voltage signal ramps down earlier than the eighth voltage signal.

In some implementations, the method further includes after a target memory cell connected to the selected word line being programmed, selecting a next target memory cell adjacent to the target memory cell toward the bit lines.

These and other objectives of the present disclosure will no doubt become obvious to those of ordinary skill in the art after reading the following detailed description of the preferred implementation that is illustrated in the various figures and drawings.

DETAILED DESCRIPTION

Memory cells in some NAND architectures have a charging storage region that holds charging to program the memory cells. Examples of a charging storage region include a floating gate and a charge trap. When programming an EEPROM or flash memory device, such as a NAND flash memory device, typically a program voltage is applied to the control gate (or selected word line) and the bit line is grounded. Electrons from the channel are injected into the charging storage region. When electrons accumulate in the charging storage region, the charging storage region becomes charged, and the threshold voltage of the memory cell is raised so that the memory cell is in a programmed state.

The special channel morphology of the middle um-programmed dummy cells and the connection area between the upper deck and the lower deck (e.g., a bottom-up programming sequence), both of which cause the accumulation of charges in the channels of the memory strings. Residual electrons may thus be trapped in storage regions of channels of the memory strings. During the programming phase, the residual electrons trapped in storage regions of the dummy cells of the unselected string may cause program disturb to memory cells of the unselected string sharing a common gate with the selected memory cell of the selected string (e.g., the selected string and the unselected string connect to the same bit line but different top select gates, or connect to different bit lines). In addition, when using the bottom-up programming, when a target (selected) memory cell is to be programmed, the memory cells between the target memory cells and the middle dummy cells are already in the programmed state, which lead to a channel turn-off effect making the bit line pre-charge process ineffectively remove the accumulated charges. The program disturb may become more serious in such a dual-deck structure. Therefore, there is a need to provide a method and memory device to reduce program disturb by reducing the accumulated trapped electrons.

It is noted that the method described according to some implementations of the present disclosure, may be applicable to a programming sequence including programming from a lower deck of the memory devices to an upper deck of the memory devices. And, in particular, the method is implemented after completing the programming of the lower deck of the memory device and start programming the upper deck of the memory devices.

Figure 1A:
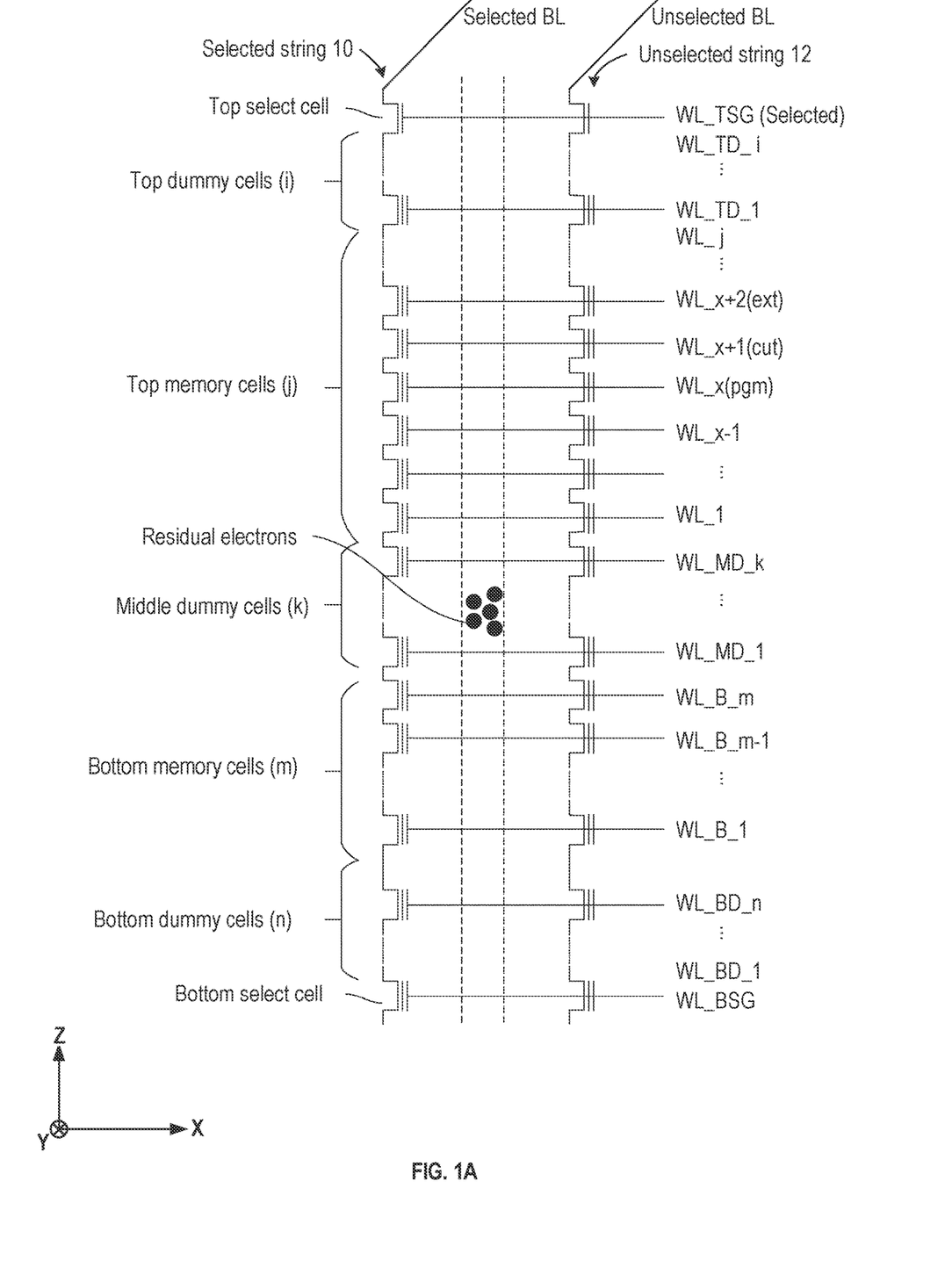
FIG. 1A illustrates residual electrons remained in a channel of an unselected string which neighbors a selected string according to some implementations of the present disclosure.

FIG. 1A illustrates residual electrons remained in a channel of an unselected string 12 which neighbors a selected string 10. In this implementation, the unselected string 12 and the selected string 10 are in different bit lines (BLs). That is, the unselected string 12 on an unselected bit line is a neighboring string adjacent to the selected string 10 connected to a selected bit line. In some implementations, the selected string 10 is the string with a target (selected) memory cell to be programmed, and the unselected string 12 are the string with unselected memory cells. A memory array may include the selected string 10 and the unselected string 12. The memory array may be a three-dimensional NAND flash memory array including a plurality of bit lines, a plurality of word lines (WLs), and a plurality of strings, wherein each of the strings extends vertically (e.g., in the z-direction), and includes a plurality of memory cells formed in a plurality of horizontal layers (e.g., in the x- or y-direction).

The strings 10 and 12 are structurally identical; for example, each of the strings 10 and 12 may include a top select cell, a plurality of top dummy cells, a plurality of first memory cells (e.g., including top memory cells), a plurality of middle dummy cells, a plurality of second memory cells (e.g., including bottom memory cells), a plurality of bottom dummy cells, and a bottom select cell, wherein the cells included in the string are serially connected. The plurality of top dummy cells includes i cells, the plurality of top memory cells includes j cells, the plurality of middle dummy cells includes k cells, the plurality of bottom memory cells includes m cells, and the plurality of bottom dummy cells includes n cells, wherein i, j, k, m and n are integers greater than 1.

A word line WL_TSG is connected to gates of the top select cells of the strings 10 and 12. The selected word line WL_TSG may connect a selected string with an unselected string. The selected string 10 is the string that are selected by the selected word line WL_TSG and the selected bit line. The unselected string 12 may be a string that is selected by the selected word line WL_TSG and the unselected bit line, a string that is selected by the unselected word line WL_TSG and the selected bit line, or a string that is selected by the unselected word line WL_TSG and the unselected bit line. A plurality of word lines WL_TD_1 to WL_TD_i is connected to a plurality of gates of the plurality of top dummy cells. A plurality of word lines WL_1 to WL_j is connected to a plurality of gates of the plurality of top memory cells of the selected string 10 and the unselected string 12. One of the plurality of word lines WL_1 to WL_j is a selected word line WL_x connected to a selected memory cell of the selected string 10 and an unselected memory cell that is horizontally (e.g., in a x- or y-direction) neighboring to the selected memory cell. The selected memory cell may be a memory cell that is selected by the selected word line WL_TSG, the selected bit line, and the selected word line WL_x. It is noted that the selected word line WL_x is a word line that connect to a target memory cell to be programmed during the programming phase. In some implementations, each programming phase may program a target memory cell in a selected string connected to the selected word line. The order of programming operation of memory cells may be from memory cells connected to bottom of the word lines to memory cells connected to the top of the word lines. One of the plurality of word lines WL_1 to WL_j is a first neighboring word line WL_x+1 connected to a first neighboring memory cell that is vertically (e.g., in a z-direction) neighboring to the selected memory cell of the selected string 10. One of the plurality of word lines WL_1 to WL_j is a second neighboring word line WL_x+2 connected to a second neighboring memory cell that is vertically (e.g., in a z-direction) neighboring to the first neighboring memory cell of the selected string 10.

A plurality of word lines WL_MD_1 to WL_MD_k is connected to a plurality of gates of the plurality of middle dummy cells of the strings 10 and 12. A plurality of word lines WL_B_1 to WL_B_m is connected to a plurality of gates of the plurality of bottom dummy cells of the strings 10 and 12. A plurality of word lines WL_BD_1 to WL_BD_n is connected to a plurality of gates of the plurality of bottom dummy cells of the strings 10 and 12. A word line WL_BSG is connected to gates of the bottom select cells of the strings 10 and 12.

A drain of the top select cell is connected to a bit line, and the bit line of the selected string 10 is always applied with zero (ground) voltage during a programming phase, while the bit lines of all the unselected string 12 and the selected string 10 are applied with a system voltage pulse Vcc during a pre-charging phase of the operation. During a pre-charging phase of the operation, a certain number of residual electrons may be trapped in storage regions of middle dummy cells of the unselected string may cause program disturb to memory cells of the unselected string sharing a common gate with the selected memory cell of the selected string. In particular, the accumulated trapped charges in the channels of the middle dummy cell of the unselected string reduce the potential of the channels and shift the threshold voltage Vt of the unselected memory cells, and thus trigger a soft program of the unselected memory cells during the programming phase. It is noted that the pre-charging phase is before the programming phase in each operation. And the pre-charging phase is used to reduce the accumulated trapped charges within channels of the memory cell in each string before the programming phase.

Figure 1B:
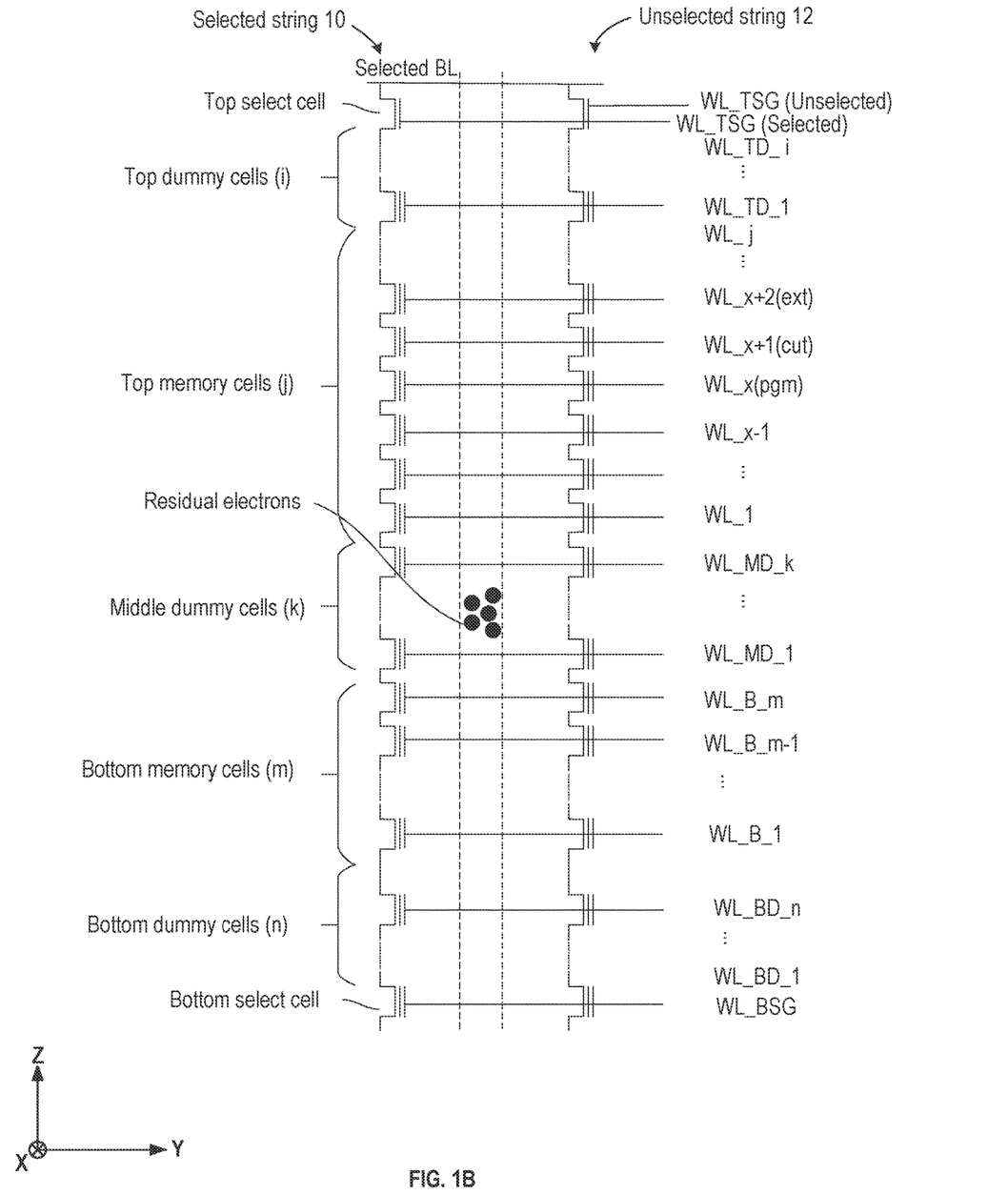
FIG. 1B illustrates residual electrons remained in a channel of another unselected string which neighbors a selected string according to some implementations of the present disclosure.

Similar to FIG. 1A, FIG. 1B illustrates residual electrons remained in a channel of another unselected string 12 which neighbors the selected string 10. In this implementation, the unselected string 12 and the selected string 10 are in the same bit line. That is, the unselected string 12 on a selected bit line is a neighboring string adjacent to the selected string 10 connected to the same selected bit line. Since it is connected to the same selected bit line, the unselected string 12 is connected to an unselected WL_TSG so that the memory cells in the unselected string 12 are not selected to be programmed.

Figure 2A:
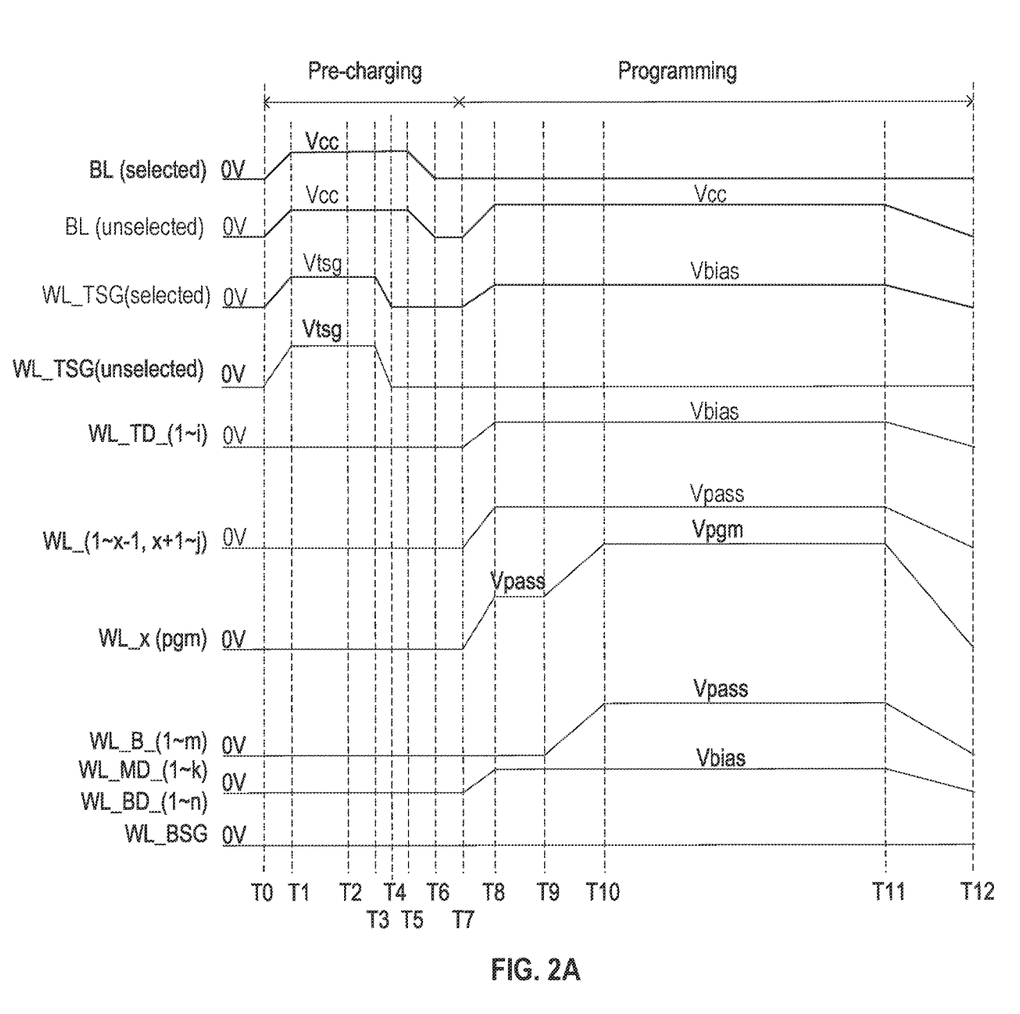
FIG. 2A is a signal diagram of an operation process for the strings in FIGS. 1A and 1B.

FIG. 2A is a signal diagram of operating the strings 10 and 12 in FIGS. 1A and 1B. During a pre-charging phase, the voltage of the bit line of the selected string 10 and the unselected string 12 increases from zero volt at time T0 to a voltage Vcc at time T1. The voltage of the word line WL_TSG increases from zero volt at time T0 to a voltage Vtsg at time T1, and the voltage of the word line WL_TSG decreases from the voltage Vtsg at time T3 to zero volt at time T4. The word lines WL_BSG, WL_BD_1 to WL_BD_n, WL_B_1 to WL_B_m, WL_MD_1 to WL_MD_k, WL_1 to WL_j, and WL_TD_1 to WL_TD_i are at zero volt during the pre-charging phase. One of the plurality of word lines WL_1 to WL_j is a selected word line WL_x.

During time T1 to time T2, a certain amount of residual electrons may be trapped in storage regions of middle dummy cells of the unselected string 12 to cause program disturb. For example, during a programming phase, in particular from time T9 to time T10, a voltage Vpass is applied to the word lines WL_B_1 to WL_B_m and WL_1 to WL_j corresponding to the unselected memory cells to reduce the channel potential of the unselected memory cells, and a voltage Vbias is applied to the word lines WL_BD_1 to WL_BD_n, WL_MD_1 to WL_MD_k and WL_TD_1 to WL_TD_i. During time T10 to time T11, a programming voltage Vpgm is applied to the selected word line WL_x. However, the residual electrons at the middle dummy cells of the unselected string 12 may cause program disturb. For example, the channel potential corresponding to the unselected memory cell of the unselected string 12 is decreased due to the residual electrons.

Figure 2B:
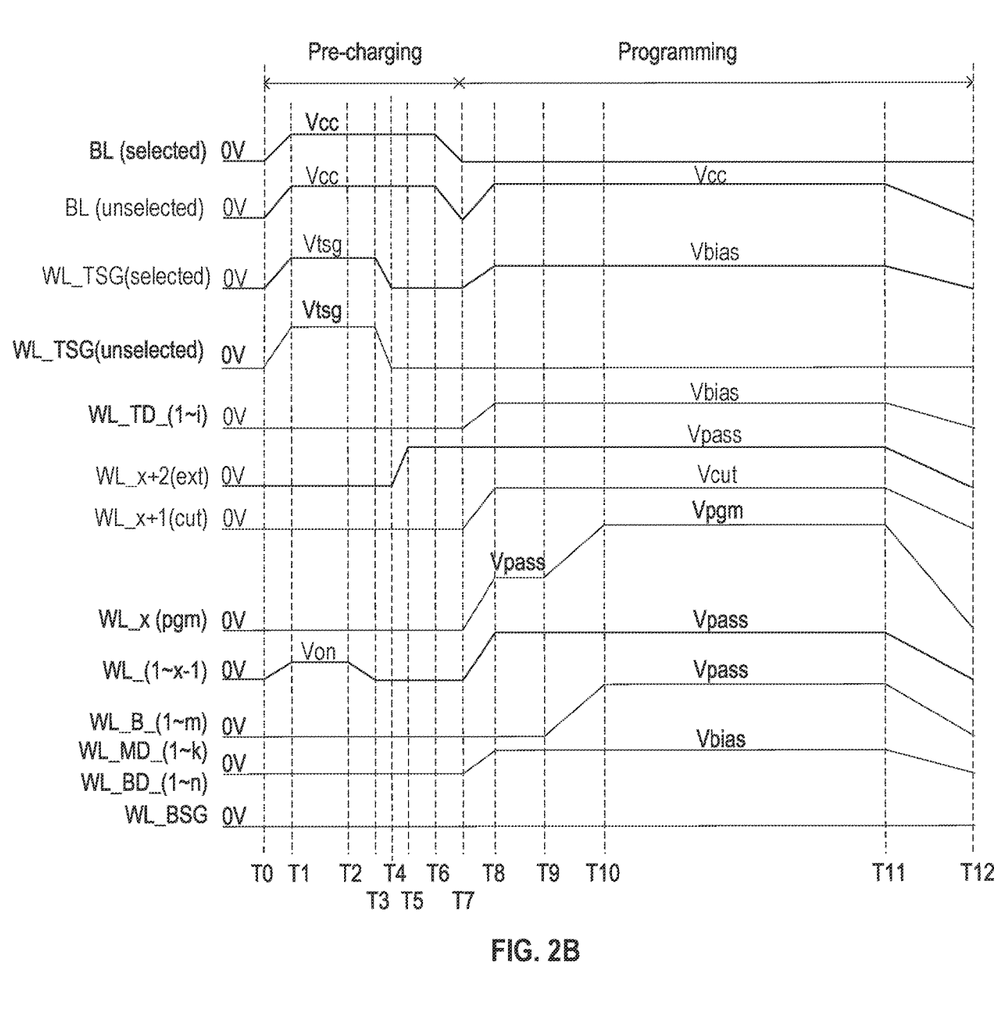
FIG. 2B is a signal diagram of another operation process for the strings in FIGS. 1A and 1B.

FIG. 2B is a signal diagram of operating the strings 10 and 12 in FIGS. 1A and 1B. At the beginning of a pre-charging phase, the voltage of the bit lines (e.g., the selected bit line and the unselected bit line) of the strings 10 and 12 increases from zero volt at time T0 to a voltage Vcc at time T1, and the voltage of the bit lines (e.g., the selected bit line and the unselected bit line) of the strings 10 and 12 decreases from the voltage Vcc at time T4 to a zero voltage at time T5 during the pre-charging phase. The voltage of the unselected word line WL_TSG and the selected word line WL_TSG increase from zero volt at time T0 to a voltage Vtsg at time T1, and the voltage of the unselected word line WL_TSG and the selected word line WL_TSG decreases from the voltage Vtsg at time T3 to zero volt at time T4 during the pre-charging phase. The voltage Vtsg applied to the selected word line WL_TSG at time T1 to time T3 may be 3-5 volt. In some implementations, the Vtsg may be sufficient to turn on the top select gate of the top select cell. The word lines WL_BSG, WL_BD_1 to WL_BD_n, WL_B_1 to WL_B_m, WL_MD_1 to WL_MD_k, WL_x to WL_j, and WL_TD_1 to WL_TD_i are at zero volt during the pre-charging phase. It is noted that by applying zero voltage, the top dummy cells connecting to the WL_TD_1 to WL_TD_i, and the top memory cells connecting to the WL(x+1~j), WLx(pgm) may be turned on during the pre-charging phase. In some implementations, it can also be other voltages so long as it can turn on the channels of these memory cells. In this implementation, WL_1 to WL_x−1 are at Von volt such that it may reduce program disturb.

During time T1 to time T2, a certain number of residual electrons may be trapped in channels of the unselected cells in the unselected string 12 to cause program disturb. For example, during a programming phase, in particular from time T9 to time T10, a voltage Vpass is applied to the word lines WL_B_1 to WL_B_m and WL_1 to WL_j corresponding to the unselected memory cells, and from time T7 to time T8, a voltage Vbias is applied to the word lines WL_BD_1 to WL_BD_n, WL_MD_1 to WL_MD_k and WL_TD_1 to WL_TD_i corresponding to the dummy cells turn on the dummy cells. During time T10 to time T11, a programming voltage Vpgm is applied to the selected word line WL_x. However, the residual electrons at the channels of the unselected string 12 may cause program disturb. For example, the channel potential corresponding to the unselected memory cell of the unselected string 12 is decreased due to the residual electrons. Therefore, by applying a Vpass to word line WL_x+2(ext) from time T4 to time T5 during the pre-charge phase and keeping the Vpass until the end of the programming phase at time T12, and by applying a Vcut to word line WL_x+1(cut) during the programming phase from time T7 to time T12, the program disturb may be reduced.

Figure 3A:
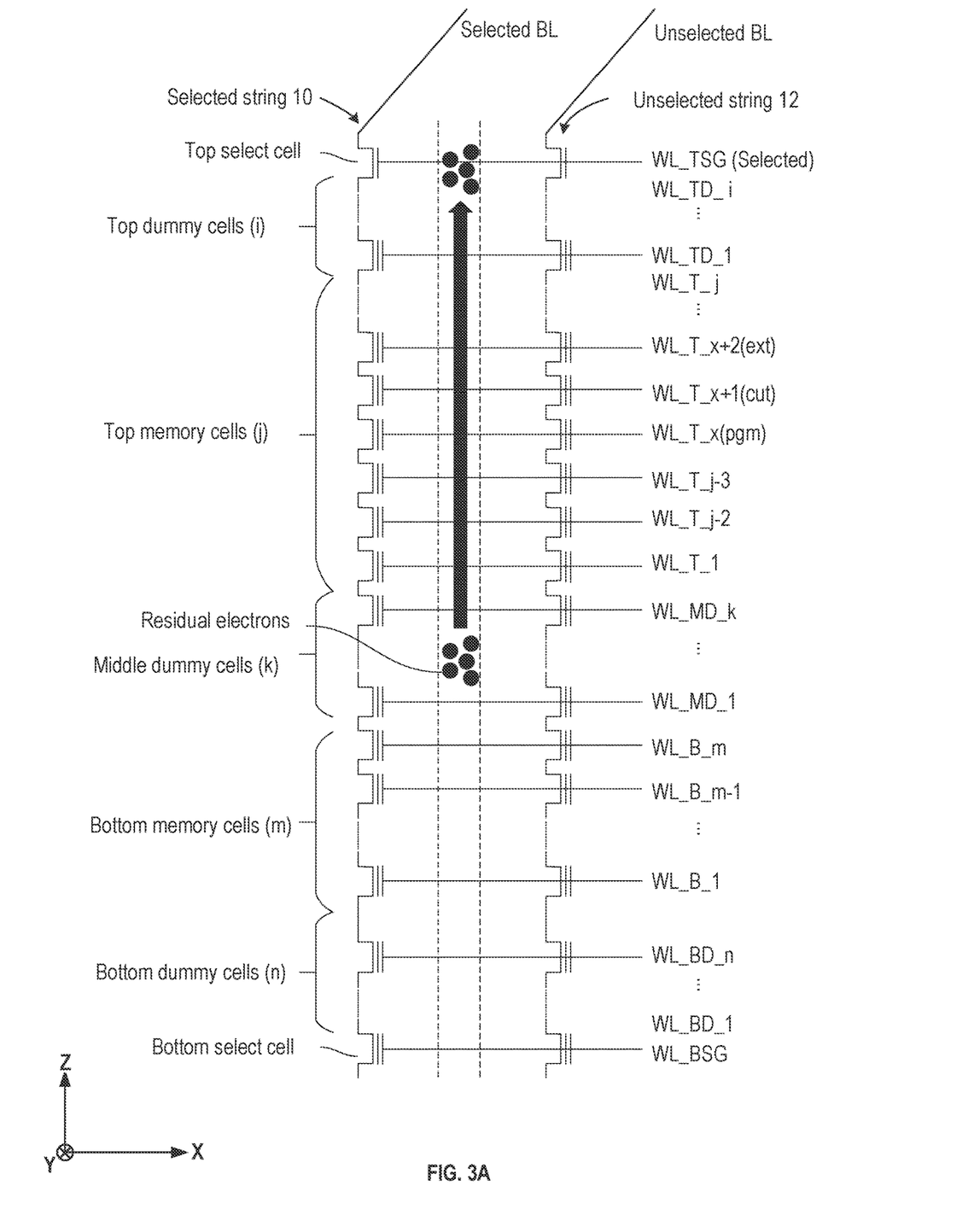
FIG. 3A illustrates movement of residual electrons remained in a channel of an unselected string which neighbors a selected string according to an implementation of the present disclosure.
Figure 4:
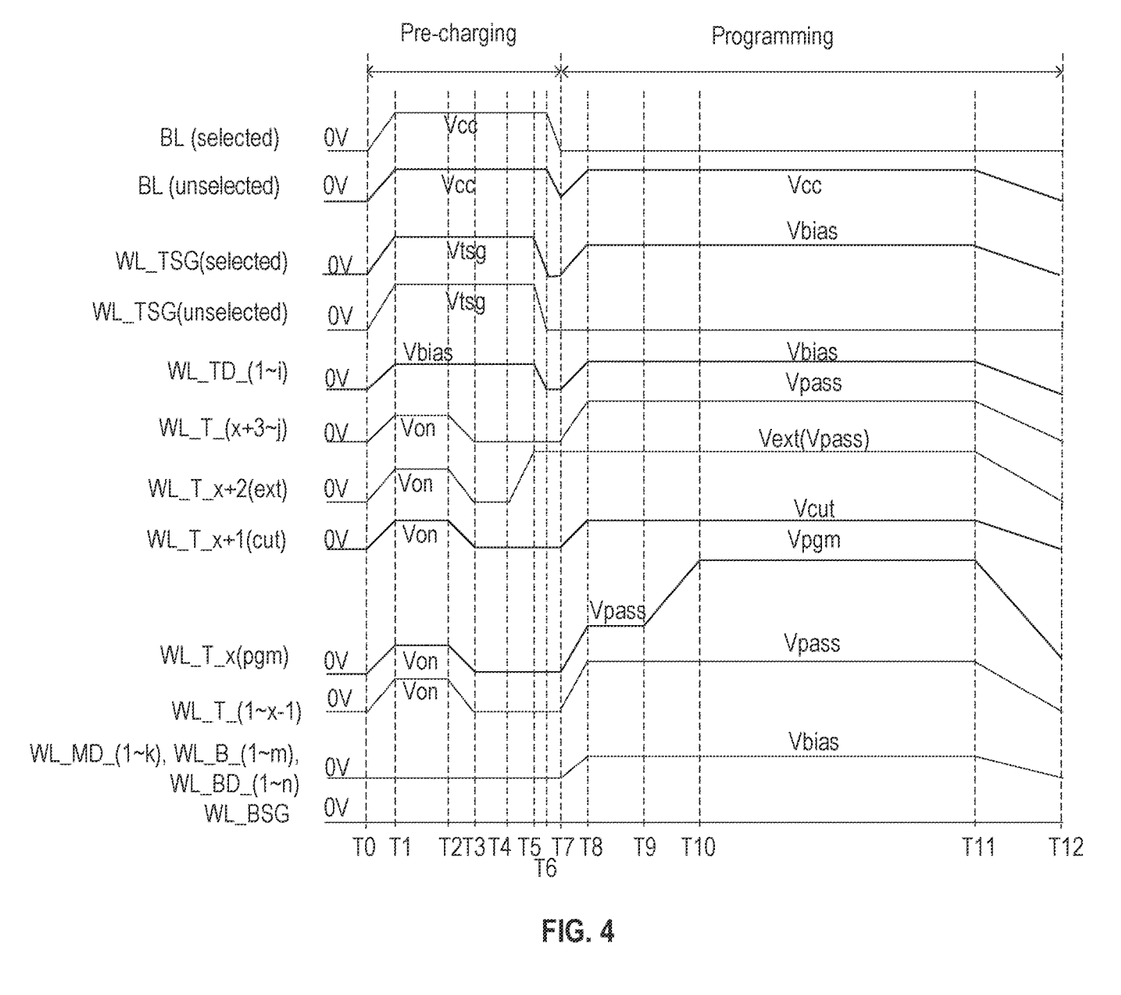
FIG. 4 is a signal diagram of an operation process for the strings in FIGS. 3A and 3B.

To reduce program disturb, please refer to FIG. 3A, which illustrates movement of residual electrons remained in a channel of an unselected string 12 which neighbors a selected string 10 according to an implementation of the present disclosure. In order to reduce the residual electrons to avoid program disturb, during the pre-charging phase, all the word lines WL_T_1 to WL_T_j corresponding to all the plurality of top memory cells are applied with a voltage Von to partially turn on the channel of the unselected string 12 at time T1 to T2, as shown in FIG. 4, thereby the residual electrons can move from the channels to the plurality of top memory cells along the partially turned-on channel. Further, during the pre-charging phase the word lines WL_T_1 to WL_T_j are applied with zero volt to partially turn off the channel of the unselected string 12 at time T3 to T4. Further, during the pre-charging phase, after the word lines WL_T_1 to WL_T_j are applied with zero volt, a voltage Vext (e.g., same as Vpass or higher than Vpass) is applied to word line WL_T_x+2 during a last period of the pre-charging phase (e.g., at time T5 to T7), as shown in FIG. 4. Finally, during the programming phase, the word line WL_T_x+1 is applied with a voltage Vcut (e.g., Vpass or less than Vpass) to turn off the top memory cell corresponding to the word line WL_T_x+1, thereby the channel of the unselected string 12 is (softly) cut off to prevent the residual electrons from moving back to the channels of the top memory cells which are below the top memory cell corresponding to the word line WL_T_x+1. As a result, the residual electrons can be removed from the channels of the unselected string 12 to avoid program disturb.

Figure 3B:
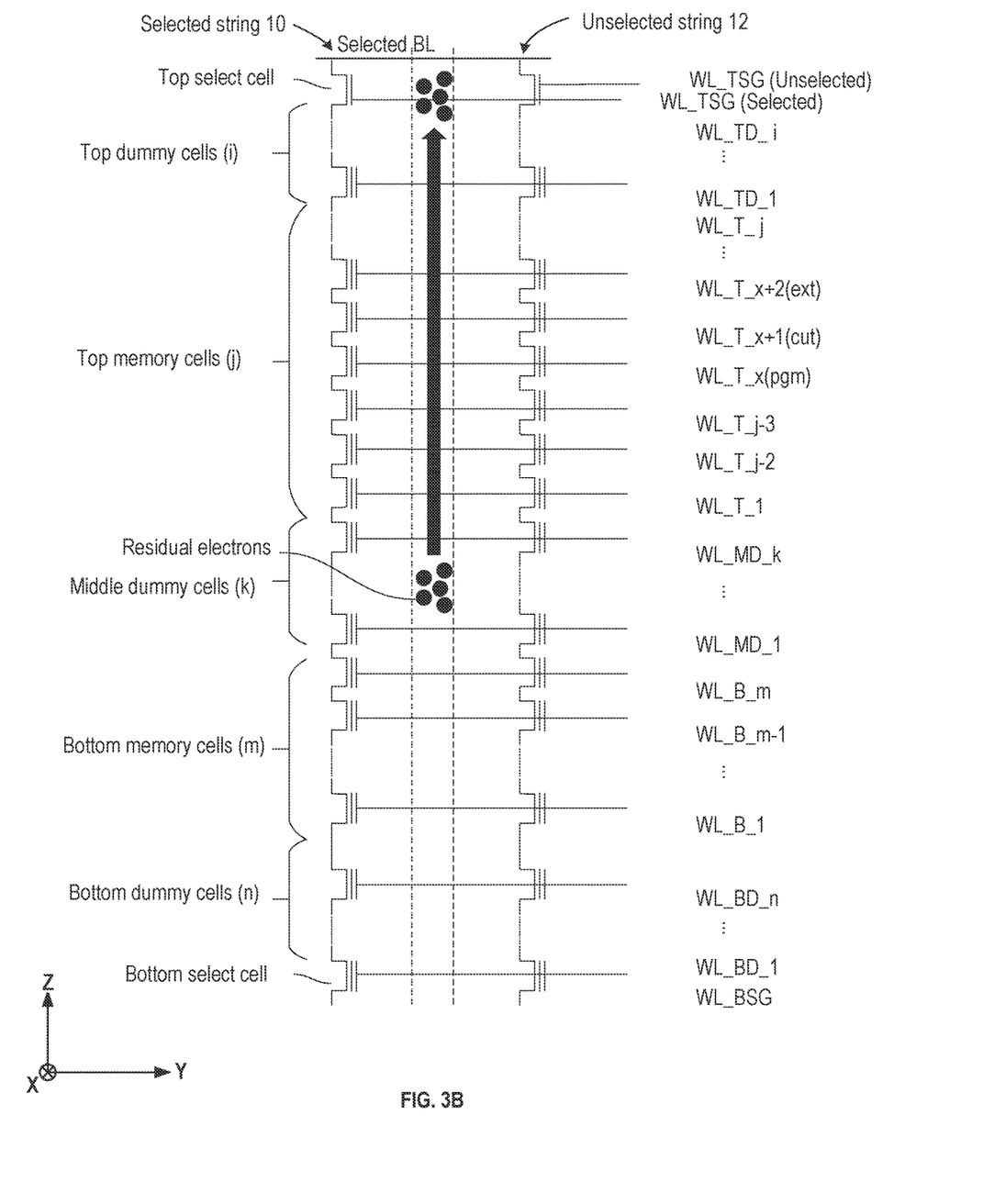
FIG. 3B illustrates movement of residual electrons remained in a channel of another unselected string which neighbors a selected string according to an implementation of the present disclosure.

Similar to FIG. 3A, FIG. 3B illustrates residual electrons remained in a channel of another unselected string 12 which neighbors the selected string 10. In this implementation, the unselected string 12 and the selected string 10 are in the same bit line. That is, the unselected string 12 on a selected bit line is a neighboring string adjacent to the selected string 12 connected to the same selected bit line. Since it is connected to the same selected bit line, the unselected string 12 is connected to an unselected WL_TSG so that the memory cells in the unselected string 12 are not selected to be programmed.

FIG. 4 is a signal diagram of an operation process for the strings 10 and 12 in FIGS. 3A and 3B. In detail, the pre-charging phase begins at time T0 and ends at time T7. A voltage of the bit line of the selected string 10 and the unselected string 12 increases from zero volt at time T0 to a voltage Vcc at time T1, the voltage Vcc is applied to the bit line of the selected string 10 and the unselected string 12 from time T1 to time T6, and the voltage of the bit line of the selected string 10 and the unselected string 12 decreases from the voltage Vcc at time T6 to zero volt at time T7. The bit line of the selected string 10 is always applied with zero volt during the programming operation from T7 to T12. The bit line of the unselected string 12 is connected to selected bit line and applied with the zero volt during the programming operation from T7 to T12. A voltage of the selected and unselected word lines WL_TSG increases from zero volt at time T0 to a voltage Vtsg at time T1, the voltage Vtsg is applied to the selected and unselected word lines WL_TSG from time T1 to time T5, and the voltage of the selected and unselected word lines WL_TSG decreases from the voltage Vtsg at time T5 to zero volt at time T6 when the pre-charging phase is about to end. The bias voltage Vbias is applied to the selected word line WL_TSG during the programming phase from T8 to T11, while a zero volt is applied to the unselected word line WL_TSG during the programming phase from T7 to T12. Voltages of the word lines WL_B_1 to WL_B_m, WL_MD_1 to WL_MD_k and WL_BD_1 to WL_BD_n are always applied with zero volt during the pre-charging phase and applied with Vbias during the programming phase. Voltages of the word lines WL_TD_1 to WL_TD_i are applied with Vbias that turns on the top dummy cells corresponding to the word lines WL_TD_1 to WL_TD_i.

Next, from time T1 to time T2, a voltage Von is applied to the word lines WL_T_1 to WL_T_j to partially turn on the channel at the plurality of top memory cells. Therefore, the residual electrons trapped at the channels of the memory cells of the unselected string 12 can move toward the top memory cells corresponding to the word lines WL_T_1 to WL_T_j when they are attracted by the voltage potential provided by the voltage Von. From time T2 to time T3, the voltage of the word lines WL_T_1 to WL_T_j decreases from the voltage Von to zero volt to turn off the channel of the unselected string 12 at the plurality of top memory cells corresponding to the word lines WL_T_1 to WL_T_j. Note that a circuit area of a control circuit configured to control a memory array depends on a complexity of the circuit design; for example, the control circuit requires a larger area to perform a more complex operation. By applying the voltage Von to all the word lines WL_T_1 to WL_T_j corresponding to all the plurality of top memory cells during the pre-charging phase, the complexity of the designing the logics of the circuit to operations in FIG. 4 is reduced in comparison with the complexity of the designing of the logics of the circuit to perform the operations in FIG. 2B.

Next, a voltage of the word line WL_T_x+2 corresponding to the second neighboring memory cell increases from zero volt at time T4 to a voltage Vext (e.g., same as Vpass) at time T5 to partially turn on the channel at the second neighboring memory cell of the unselected string 12 during the last period of the pre-charging phase. Therefore, the residual electrons at the top memory cells corresponding to the word lines WL_T_1 to WL_T_x+1 can move to the second neighboring memory cell corresponding to the word line WL_T_x+2 when they are attracted by the voltage potential provided by the voltage Vext (Vpass). Note that the voltage Vext is applied to the word line WL_T_x+2 from time T5 at the latter part of the pre-charging phase to time T11 of the programming phase; from another point of view, the second neighboring memory cell corresponding to the word line WL_T_x+2 is turned on prior to the rest of the plurality of word lines WL_T_1 to WL_T_x+1 and WL_T_x+3 to WL_j to boost the channel potential corresponding to the word line WL_T_x+2 before entering the programming phase. In particular, since the WL_TSG decreases from time T5 to time T6 and stay zero volt at T7, the channels of the memory cells below the top select cells corresponding to WL_TSG may become floating, and thus by applying the ext voltage Vext to the WL_T_x+2, the channel potential of the memory cell corresponding to the WL_T_x+2 may be boosted while the channel potential of the memory cells corresponding to the WL_T_x+1 may be softly cut off. Therefore, the channels between the memory cell corresponding to the WL_T_x+2 and the memory cell corresponding to the WL_T_x may form a stepwise channel potential, which allows the trapped electrons to move from the channels of the memory cells of the selected word line to the memory cell corresponding to the WL_T_x+2, thereby reducing the program disturb. Furthermore, by decreasing the voltage applied to WL_TSG (e.g., from time T5 to T6) before decreasing the voltage applied to the bit line (e.g., from time T6 to time T7), the stepwise channel potential can be formed, and the trapped electrons can be withdrawn from the channels of the memory cells of the selected word line toward the memory cell corresponding to the WL_T_x+2.

In some implementations, there may be one or more cut word lines WL_T_x+1, for instance, two or three cut word lines. These cut word lines may be applied with the same or different cut voltages Vcut. While these cut voltages may be different, their corresponding voltages are limited to a voltage level which can softly cut off the channels of the unselected memory cells of the unselected strings to prevent the trapped electrons moving back to the channels of the memory cells which are below the memory cell corresponding to these cut word lines. In some implementations, cut voltages applied to multiple cut word lines may vary according to the distance to the selected word line WL_T_x. In particular, the closer of the cut word line to the selected word line is, the higher cut voltage applied thereto is. In some implementations, there may be one or more word lines that is not applied with cut voltages formed between the cut word lines and the selected word line. Therefore, these intermediate word lines may prevent the cut word lines directly affecting the channel potential of the selected word line.

In some implementations, there may be one or more ext word lines WL_T_x+2, for instance, two or three ext word lines. These ext word lines may be applied with the same or different ext voltages Vext. While these ext voltages may be different, their corresponding voltages are high enough to attract the trapped electrons toward memory cells corresponding to these ext word lines and raise the voltage potential of the memory cells corresponding to these ext word lines.

The pre-charging phase ends at time T7, the programming phase begin at time T7 and end at time T12, in FIG. 4.

In detail, the voltage of the word line WL_T_x+1 corresponding to the first neighboring memory cell increases from zero volt at time T7 to a voltage Vcut at time T8, the voltage Vcut is applied to the word line WL_T_x+1 from time T8 to T11, and the voltage of the word line WL_T_x+1 decreases from the voltage Vcut at time T11 to zero volt at time T12. The voltage Vcut, in some implementations, is lower than the programming voltage Vpgm and the Vpass. In some implementations, Vcut may be higher than 0 volt and no more than 6 volt, for example, the Vcut may be 0.1, 0.2, 0.3, 0.4, 0.5, 0.6, 0.7, 0.8, 0.9, 1, 2, 3, 4, or 5 volt. In some implementations, the Vpgm may be ranged from 10 volt to 30 volt, for example, the Vpgm may be 10, 11, 12, 13, 14, 15, 16, 17, 18, 19, 20, 21, 22, 23, 24, 25, 26, 27, 28, 29, or 30 volt. Voltages of the word lines WL_T_1 to WL_T_x−1, WL_T_x+3 to WL_T_j, WL_B_1 to WL_B_m increase from zero volt at time T7 to the voltage Vpass at time T8, the voltage Vpass is applied to the word lines WL_T_1 to WL_T_x−1, WL_T_x+3 to WL_T_j, WL_B_1 to WL_B_m from time T8 to time T11, and the voltages of the word lines WL_T_1 to WL_T_x−1, WL_T_x+3 to WL_T_j, WL_B_1 to WL_B_m decrease from the voltage Vpass at time T11 to zero volt at time T12. In some implementations, the Vpass is lower than the programming voltage Vprm. In some implementations, Vpass may be ranged from 6 volt to 9 volt, for example, the Vpass may be 6, 7, 8, or 9 volt. Voltages of the word lines WL_TD_1 to WL_TD_i, WL_MD_1 to WL_MD_k and WL_BD_1 to WL_BD_n increase from zero volt at time T7 to a voltage Vbias at time T8, the voltage Vbias is applied to the word lines WL_TD_1 to WL_TD_i, WL_MD_1 to WL_MD_k and WL_BD_1 to WL_BD_n from time T8 to time T11, and the voltages of the word lines WL_TD_1 to WL_TD_i, WL_MD_1 to WL_MD_k and WL_BD_1 to WL_BD_n decrease from the voltage Vbias at time T11 to zero volt at time T12. In some implementations, the Vbias may be close to zero voltage or higher than a threshold voltage of each memory cells or dummy memory cells. In some implementations, the Vbias may be ranged from 0 to 3 volt, for example, the Vbias can be 0.1, 0.2, 0.3, 0.4, 0.5, 0.6, 0.7, 0.8, 0.9, 1, 2, or 3 volt. In some implementations, word lines WL_TD_1 to WL_TD_i, may be applied with stepwise voltages. For example, the voltages applied to WL_TD may be gradually decreased from 9 volts to 3 volts from upper WL_TD_j to lower WL_TD_1 stepwise.

During the programming phase, the word line WL_T_x+2 corresponding to the second neighboring memory cell is applied with the voltage Vext (e.g., may be same as Vpass) from time T5 to time T11, the word line WL_T_x+1 corresponding to the first neighboring memory cell is applied with the voltage Vcut from time T8 to time T11, and the word line WL_T_x corresponding to the selected memory cell is applied with the voltage Vpass from time T8 to time T9 and a voltage Vpgm from time T10 to time T11, wherein the voltage Vcut is smaller than the voltages Vpass and Vpgm, and Vpass is smaller than Vpgm. Therefore, the first neighboring memory cell is weakly turned off by applying the voltage Vcut, thereby cutting off the channels of the unselected string 12, and memory cells located above the first neighboring memory cell are isolated from the memory cells below the first neighboring memory cell. As a result, the residual electrons can be discharged from the bit line of the unselected string 12, through the first neighboring memory cell which is weakly turned off to prevent the residual electrons from being attracted by the voltage potential provided by the voltage Vpass or Vpgm.

During the programming phase from time T8 to time T11), the channel potential of the unselected string 12 is boosted by applying the voltage Vpass to the word lines WL_T_1 to WL_T_x−1, WL_T_x+3 to WL_T_j, WL_B_1 to WL_B_m and applying the voltage Vbias to the word lines corresponding to the dummy cells, which prevents the memory cell of the unselected string 12 corresponding to the selected word line WL_T_x from being unintentionally programmed by the voltage Vpgm.

During the programming phase, the channel potential corresponding to the selected memory cell is boosted by applying the voltage Vpass from time T8 to time T9. The voltage Vpgm is applied to the selected word line WL_x corresponding to the selected memory cell of the selected string 10 to perform a programming operation from time T10 to time T11.

Finally, the programming phase are about to end from time T11, and all the bit lines and all the word lines decrease to zero volt at time T12 when the programming phase end.

As a result, the residual electrons can be removed from the unselected string 12 during the pre-charging phase, so as to reduce program disturb during the programming phase. Moreover, by applying the voltage Von to all the word lines WL_T_1 to WL_T_j corresponding to all the plurality of top memory cells to turn on the plurality of top memory cells, the complexity of the programming operation in FIG. 4 is reduced in comparison with the complexity of the programming operation in FIG. 2B.

Figure 5:
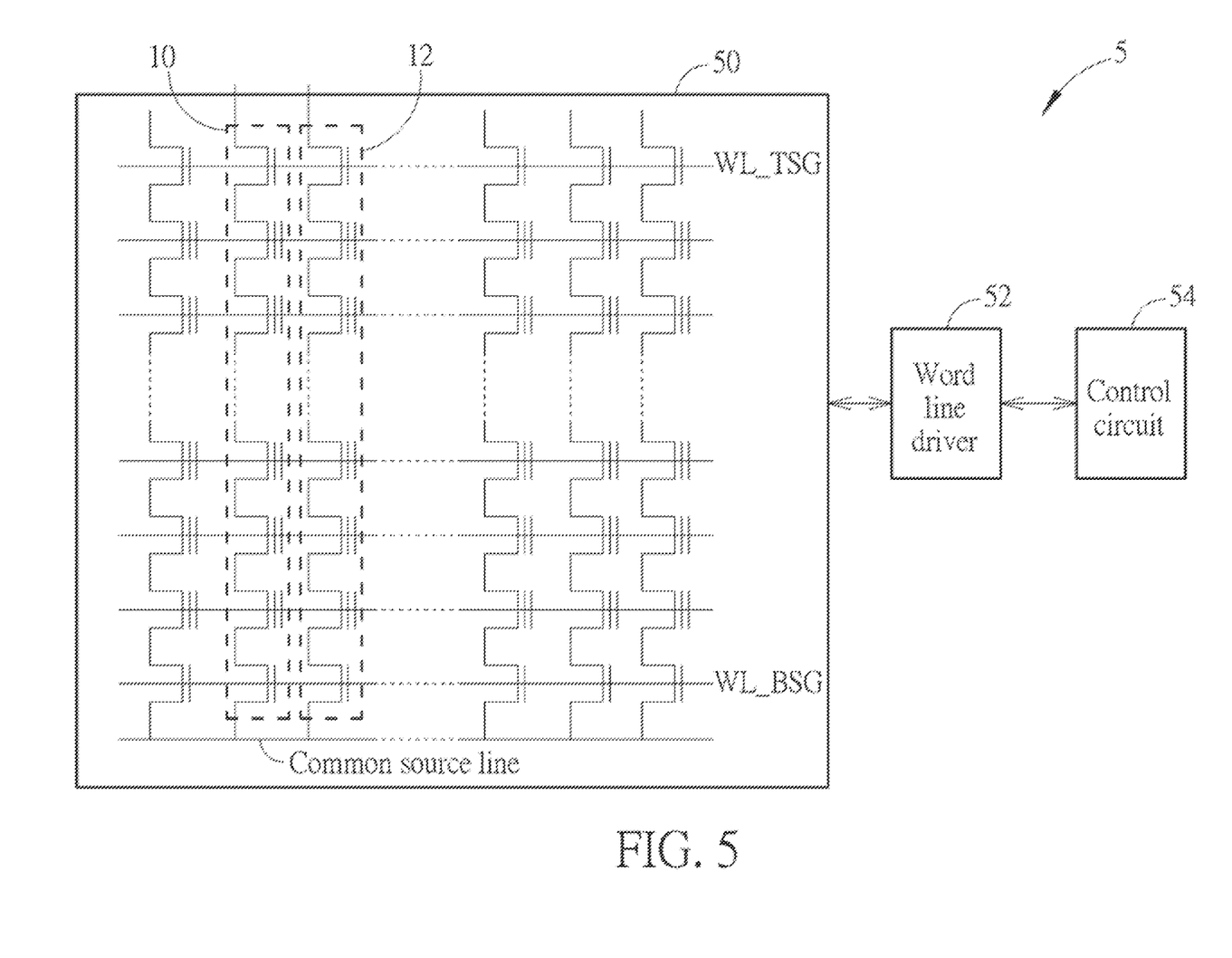
FIG. 5 is a functional block diagram of a memory device according to an implementation of the present disclosure.

FIG. 5 is a functional block diagram of a memory device 5 according to an implementation of the present disclosure. The memory device 5 includes a memory array 50, a word line driver 52 and a control circuit 54. The memory device 5 may be a three-dimensional NAND flash memory device. The memory array 50 includes a plurality of bit lines (BL), a plurality of word lines and a plurality of strings (e.g., the strings 10 and 12 in FIG. 3). Each string includes a plurality of memory cells and a plurality of dummy cell, wherein a plurality of memory cells and the plurality of dummy cell are connected in series and extend vertically above a substrate (not shown). The control circuit 54 is configured to generate a plurality of control signals (e.g., addresses, commands, or controls) to the word line driver 52 to perform operations of the memory device 5. The word line driver 52 is coupled to the control circuit 54 and the memory array 50, and configured to generate a plurality of voltages applied to the plurality of word lines of the memory array 50 according to the plurality of control signals generated by the control circuit 54.

Figure 6:
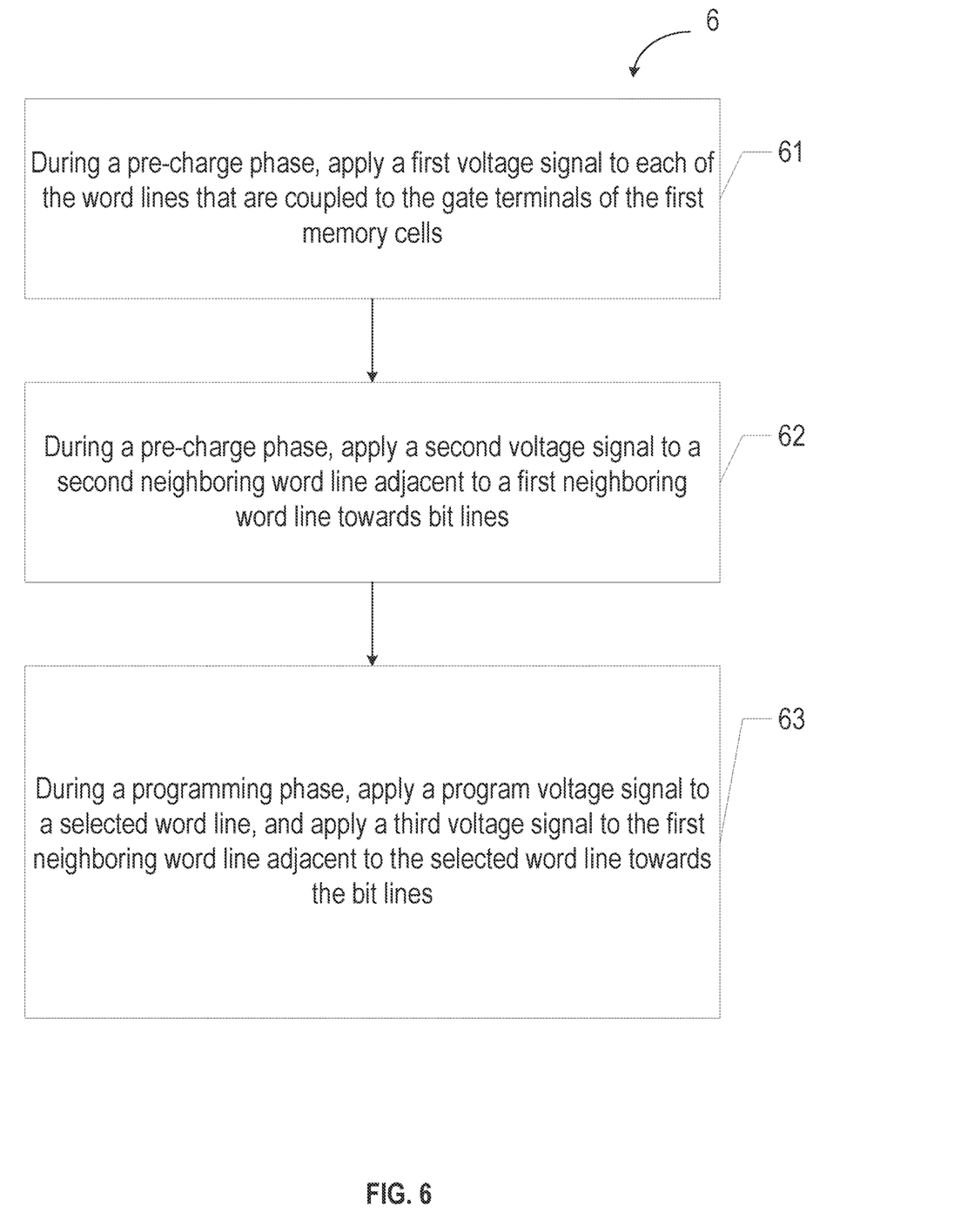
FIG. 6 is a flowchart of a process of operation for the strings in FIGS. 3A and 3B according to an implementation of the present disclosure.

FIG. 6 is a flowchart of a process 6 of operations of the strings in FIGS. 3A and 3B according to some implementations of the present disclosure. The process 6 may be performed by the control circuit 54, and include the following steps.

Step 61: During a pre-charging phase, apply a first voltage to each of the word lines that are coupled to the gate terminals of the first memory cells. The word lines that are coupled to the gate terminals of the first memory cells are located vertically above a plurality of middle dummy word lines.

Step 62: During the pre-charging phase, apply a second voltage to a second neighboring word line adjacent to a first neighboring word line towards bit lines. The second neighboring word line is one of the plurality of word lines and located vertically above the selected word line of the plurality of word lines.

Step 63: During a programming phase, apply a program voltage to the selected word line, apply the second voltage to the second neighboring word line and a plurality of first word lines of the plurality of word lines, apply a third voltage to the first neighboring word line adjacent to the selected word line towards the bit lines. The first neighboring word line is one of the plurality of word lines but excluded from the plurality of first word lines and located vertically below the second neighboring word line and above the selected word line.

In Step 61, during the pre-charging phase, the control circuit 54 is configured to apply a first voltage (e.g., Von) to a plurality of word lines (e.g., WL_T_1 to WL_T_j) that are coupled to the gate terminals of the first memory cells, wherein the plurality of word lines (e.g., WL_T_1 to WL_T_j) is located vertically above a plurality of middle dummy word lines (e.g., WL_MD_1 to WL_MD_k). Therefore, the residual electrons trapped in the channels of the unselected strings can move upward to the top memory cells corresponding to the word lines WL_T_1 to WL_T_j.

In Step 62, during the pre-charging phase, the control circuit 54 is configured to apply a second voltage (e.g., Vpass) to a second neighboring word line (e.g., WL_T_x+2(ext)) adjacent to a first neighboring word line (e.g., WL_T_x+1(cut)) towards bit lines, wherein the second neighboring word line (e.g., WL_T_x+2(ext)) is one of the plurality of word lines (e.g., WL_T_1 to WL_T_j) and located vertically above a selected word line (e.g., WL_T_x (pgm)) of the plurality of word lines.

In Step 63, during the programming phase, the control circuit 54 is configured to apply a program voltage (e.g., Vpgm) to the selected word line, apply the second voltage (e.g., Vpass) to the second neighboring word line (e.g., WL_T_x+2) and a plurality of first word lines (e.g., WL_T_x+3 to WL_T_j), and apply a third voltage (e.g., Vcut) to the first neighboring word line (e.g., WL_T_x+1), wherein the first neighboring word line (e.g., WL_T_x+1) is one of the plurality of word lines but excluded from the plurality of first word lines and located vertically below the second neighboring word line (e.g., WL_T_x+2) and above the selected word line (e.g., WL_T_x). Therefore, since the third voltage Vcut is smaller than the second voltage Vpass, the channel of the unselected string 12 is partially turned off to prevent the residual electrons from moving back to the top memory cells which are below the top memory cell corresponding to the word line WL_T_x+1. As a result, the residual electrons can be removed from the unselected string 12 to reduce program disturb.

To sum up, the present disclosure provides a method of operations to remove residual electrons trapped in the channels of the unselected string during the pre-charging phase, so as to reduce program disturb. Further, by applying the voltage Von to all the word lines WL_T_1 to WL_T_j corresponding to all the plurality of top memory cells during the pre-charging phase, the complexity of the programming operation in FIG. 4 can be reduced in comparison with the complexity of the programming operation in FIG. 2B.

Figure 7:
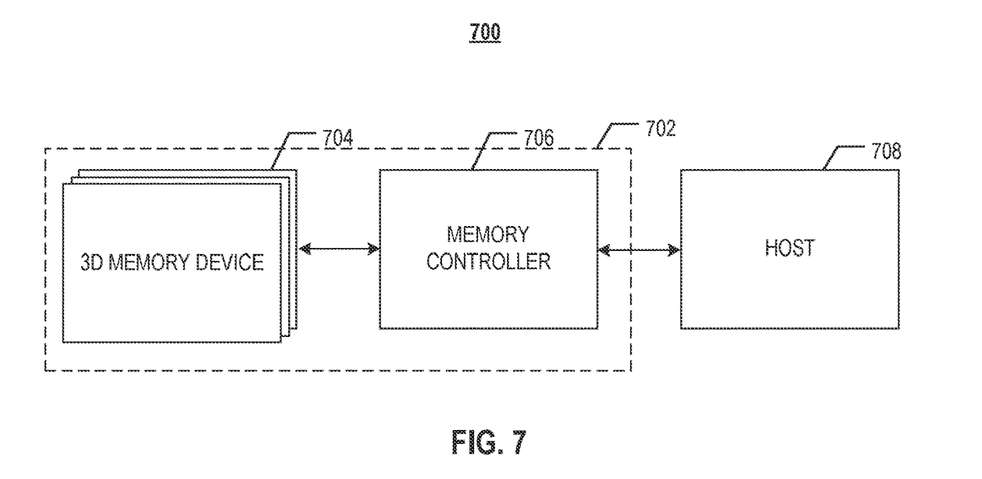
FIG. 7 illustrates a block diagram of an exemplary system having a 3D memory device, according to some aspects of the present disclosure.

FIG. 7 illustrates a block diagram of an exemplary system 700 having a 3D memory device, according to some aspects of the present disclosure. System 700 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 7, system 700 can include a host 708 and a memory system 702 having one or more 3D memory devices 704 and a memory controller 706. Host 708 can be a processor of an electronic device, such as a central processing unit (CPU), or a system-on-chip (SoC), such as an application processor (AP). Host 708 can be configured to send or receive data to or from 3D memory devices 704.

3D memory device 704 can be any 3D memory devices disclosed herein, such as 3D memory devices 150 and 250 shown in FIGS. 14A and 14B. In some implementations, each 3D memory device 704 includes a NAND Flash memory. Consistent with the scope of the present disclosure, the channel layer 111 of 3D memory device 704 can be partially doped such that part of the channel layer 111 that forms the source contact is highly doped to lower the potential barrier while leaving another part of the channel layer 111 that forms the memory cells remaining undoped or lowly doped. One end of each channel structure of 3D memory device 704 can be opened from the backside to expose the doped part of the respective channel layer 111. 3D memory device 704 can further include a doped semiconductor layer electrically connecting the exposed doped parts of the channel layer 111 to further reduce the contact resistance and sheet resistance. As a result, the electric performance of 3D memory device 704 can be improved, which in turn improves the performance of memory system 702 and system 700, e.g., achieving higher operation speed.

Memory controller 706 is coupled to 3D memory device 704 and host 708 and is configured to control 3D memory device 704, according to some implementations. Memory controller 706 can manage the data stored in 3D memory device 704 and communicate with host 708. In some implementations, memory controller 706 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 706 is designed for operating in a high duty-cycle environment SSDs or embedded multi-media-cards (eMMCs) used as data storage for mobile devices, such as smartphones, tablets, laptop computers, etc., and enterprise storage arrays. Memory controller 706 can be configured to control operations of 3D memory device 704, such as read, erase, and program operations. Memory controller 706 can also be configured to manage various functions with respect to the data stored or to be stored in 3D memory device 704 including, but not limited to bad-block management, garbage collection, logical-to-physical address conversion, wear leveling, etc. In some implementations, memory controller 706 is further configured to process error correction codes (ECCs) with respect to the data read from or written to 3D memory device 704. Any other suitable functions may be performed by memory controller 706 as well, for example, formatting 3D memory device 704. Memory controller 706 can communicate with an external device (e.g., host 708) according to a particular communication protocol. For example, memory controller 706 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 8A:
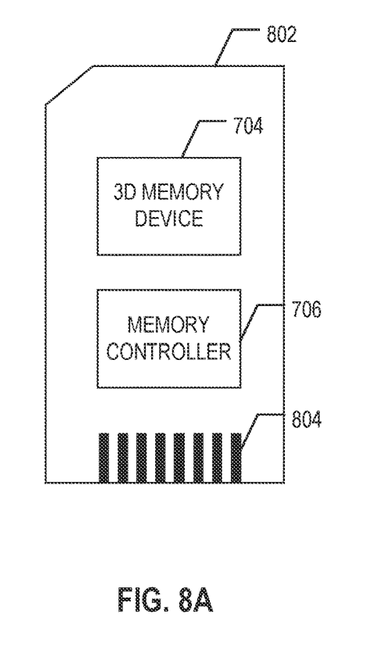
FIG. 8A illustrates a diagram of an exemplary memory card having a 3D memory device, according to some aspects of the present disclosure.
Figure 8B:
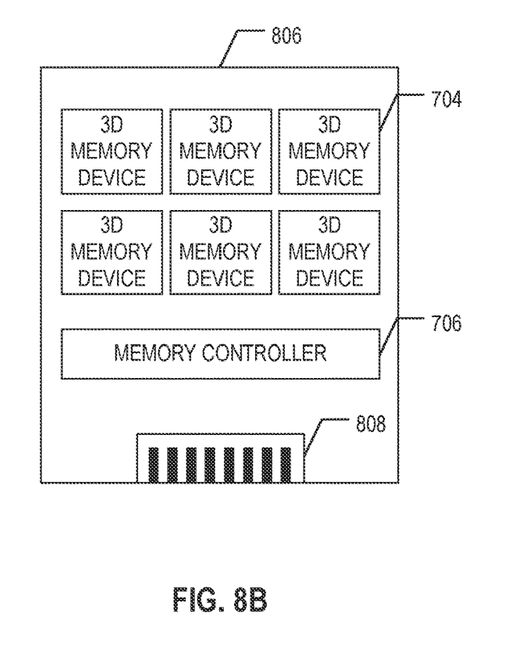
FIG. 8B illustrates a diagram of an exemplary solid-state drive (SSD) having a 3D memory device, according to some aspects of the present disclosure.

Memory controller 706 and one or more 3D memory devices 704 can be integrated into various types of storage devices, for example, be included in the same package, such as a universal Flash storage (UFS) package or an eMMC package. That is, memory system 702 can be implemented and packaged into different types of end electronic products. In one example as shown in FIG. 8A, memory controller 706 and a single 3D memory device 704 may be integrated into a memory card 802. Memory card 802 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 802 can further include a memory card connector 804 electrically coupling memory card 802 with a host (e.g., host 708 in FIG. 7). In another example as shown in FIG. 8B, memory controller 706 and multiple 3D memory devices 704 may be integrated into an SSD 806. SSD 806 can further include an SSD connector 808 electrically coupling SSD 806 with a host (e.g., host 708 in FIG. 7). In some implementations, the storage capacity and/or the operation speed of SSD 806 is greater than those of memory card 802.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A memory device, comprising:
   a memory array comprising memory strings, each memory string comprising a plurality of first memory cells, a plurality of second memory cells, and one or more dummy memory cells between the first memory cells and the second memory cells, wherein the first memory cells are between drain terminals of the memory strings and the dummy memory cells, and the second memory cells are between source terminals of the memory strings and the dummy memory cells;
   a plurality of bit lines respectively coupled to drain terminals of the memory strings;
   a plurality of word lines respectively coupled to gate terminals of the first memory cells and the second memory cells;
   a control circuit configured to provide one or more control signals to control operations of the memory array; and
   a word line driver coupled to the control circuit and the word lines and configured to:
   in response to the one or more control signals, apply a first voltage signal to each of the word lines that are coupled to the gate terminals of the first memory cells during a pre-charge phase prior to a programming phase;
   apply a second voltage signal to a first word line during the programming phase, and the first word line is adjacent to a selected word line towards the bit lines; and
   apply a third voltage signal greater than the second voltage signal to a second word line during a last time period of the pre-charge phase, and the second word line is adjacent to the first word line towards the bit lines.

2. The memory device of claim 1, wherein the word line driver is further configured to apply a fourth voltage signal greater than the second voltage signal to the each of the word lines that are coupled to the gate terminals of the first memory cells except the selected word line and the first word line during the programming phase.

3. The memory device of claim 2, wherein the word line driver is further configured to apply a fifth voltage signal greater than the fourth voltage signal to the selected word line during the programming phase.

4. The memory device of claim 1, wherein the word line driver is further configured to apply a sixth voltage signal to a first top select word line and a second top select word line of the word lines during the pre-charge phase, and apply a seventh voltage signal to the second top select word line of the word lines during the programming phase.

5. The memory device of claim 4, wherein
the bit lines comprise a first bit line coupled to the drain terminal of a selected memory string of the memory strings; and
a control signal of the one or more control signals is configured to cause applying an eighth voltage signal to the first bit line during the pre-charge phase.

6. The memory device of claim 5, wherein the six voltage signal ramps down earlier than the eighth voltage signal.

7. The memory device of claim 1, wherein the word line driver is further configured to:
apply a ninth voltage signal to a third word line during the pre-charge phase, and the third word line is adjacent to the selected word line towards a first bottom select word line of the word lines.

8. The memory device of claim 7, wherein the word line driver is further configured to:
apply the ninth voltage signal to all the word lines corresponding to the first memory cells during the pre-charge phase.

9. The memory device of claim 7, wherein the ninth voltage signal ramps down earlier than a sixth voltage signal applied to a first top select word line and a second top select word line of the word lines during the pre-charge phase.

10. A method for operating a memory device, the memory device comprising (1) memory strings, each memory string comprising a plurality of first memory cells, a plurality of second memory cells, and one or more dummy memory cells between the first memory cells and the second memory cells, wherein the first memory cells are between drain terminals of the memory strings and the dummy memory cells, and the second memory cells are between source terminals of the memory strings and the dummy memory cells, (2) a plurality of bit lines respectively coupled to drain terminals of the memory strings, and (3) a plurality of word lines respectively coupled to gate terminals of the first memory cells and the second memory cells, wherein the method comprises:
providing one or more control signals to control operations of the memory strings; and
in response to the one or more control signals, applying a first voltage signal to each of the word lines that are coupled to the gate terminals of the first memory cells during a pre-charge phase prior to a programming phase;
applying a second voltage signal to a first word line during the programming phase, wherein the first word line is adjacent to a selected word line towards the bit lines; and
applying a third voltage signal greater than the second voltage signal to a second word line during a last time period of the pre-charge phase, and the second word line is adjacent to the first word line towards the bit lines.

11. The method of claim 10, further comprising:
applying a fourth voltage signal greater than the second voltage signal to the each of the word lines that are coupled to the gate terminals of the first memory cells except the selected word line and the first word line during the programming phase.

12. The method of claim 11, further comprising:
applying a fifth voltage signal greater than the fourth voltage signal to the selected word line during the programming phase.

13. The method of claim 11, further comprising:
applying the third voltage signal to the second word line before applying the fourth voltage signal to each of the word lines except the selected word line and the first word line.

14. The method of claim 10, further comprising:
applying a sixth voltage signal to a first top select word line and a second top select word line of the word lines during the pre-charge phase, and apply a seventh voltage signal to the second top select word line of the word lines during the programming phase.

15. The method of claim 14, wherein the bit lines comprise a first bit line coupled to the drain terminal of a selected memory string of the memory strings, and the method further comprises:
applying an eighth voltage signal to the first bit line during the pre-charge phase, wherein the six voltage signal ramps down earlier than the eighth voltage signal.

16. The method of claim 12, further comprising:
after a target memory cell connected to the selected word line being programmed, selecting a next target memory cell adjacent to the target memory cell toward the bit lines.

17. The method of claim 10, further comprising:
applying a ninth voltage signal to a third word line during the pre-charge phase, and the third word line is adjacent to the selected word line towards a first bottom select word line of the word lines.

18. The method of claim 17, further comprising:
applying the ninth voltage signal to all the word lines corresponding to the first memory cells during the pre-charge phase.

19. The method of claim 17, wherein the ninth voltage signal ramps down earlier than a sixth voltage signal applied to a first top select word line and a second top select word line of the word lines during the pre-charge phase.

* * * * *